(12) United States Patent
Lee et al.

(10) Patent No.: US 11,114,540 B2
(45) Date of Patent: Sep. 7, 2021

(54) SEMICONDUCTOR DEVICE INCLUDING STANDARD CELLS WITH HEADER/FOOTER SWITCH INCLUDING NEGATIVE CAPACITANCE

(71) Applicant: TAIWAN SEMICONDUCTOR MANUFACTURING CO., LTD., Hsinchu (TW)

(72) Inventors: Chien-Hsing Lee, Taipei (TW); Chih-Sheng Chang, Hsinchu (TW); Wilman Tsai, Saratoga, CA (US); Chia-Wen Chang, Taipei (TW); Ling-Yen Yeh, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/585,515

(22) Filed: Nov. 4, 2019

(65) Prior Publication Data

US 2020/0052087 A1 Feb. 13, 2020

Related U.S. Application Data

(62) Division of application No. 15/707,577, filed on Sep. 18, 2017, now Pat. No. 10,868,132.

(51) Int. Cl.
*H01L 29/51* (2006.01)
*H01L 27/11* (2006.01)
(Continued)

(52) U.S. Cl.
CPC ........ *H01L 29/516* (2013.01); *H01L 27/0924* (2013.01); *H01L 27/1104* (2013.01);
(Continued)

(58) Field of Classification Search
CPC .......... H01L 21/28291; H01L 29/6684; H01L 29/78391; H01L 28/40–92;
(Continued)

(56) References Cited

U.S. PATENT DOCUMENTS 7,944,285 B1 5/2011 Thirunavukarasu et al.
2003/0071681 A1 4/2003 Fujimori
(Continued)

FOREIGN PATENT DOCUMENTS

DE 102017110434 A1 5/2018
JP 3694793 B2 9/2005
(Continued)

OTHER PUBLICATIONS

Zhi Cheng Yuan et al., "Switching-Speed Limitations of Ferroelectric Negative-Capacitance FETs," IEEE Transaction on Electron Devices, vol. 63, Issue 10, pp. 4046-4052, (Oct. 2016).
(Continued)

*Primary Examiner* — Nelson Garces
(74) *Attorney, Agent, or Firm* — McDermott Will & Emery LLP

(57) ABSTRACT

A semiconductor device includes a first potential supply line for supplying a first potential, a second potential supply line for supplying a second potential lower than the first potential, a functional circuit, and at least one of a first switch disposed between the first potential supply line and the functional circuit and a second switch disposed between the second potential supply line and the functional circuit. The first switch and the second switch are negative capacitance FET.

20 Claims, 16 Drawing Sheets

(51) Int. Cl.
- *H01L 27/092* (2006.01)
- *H01L 21/28* (2006.01)
- *H01L 29/16* (2006.01)
- *H01L 29/40* (2006.01)
- *H01L 29/66* (2006.01)
- *H01L 29/78* (2006.01)

(52) U.S. Cl.
CPC ............ *H01L 29/16* (2013.01); *H01L 29/401* (2013.01); *H01L 29/40114* (2019.08); *H01L 29/511* (2013.01); *H01L 29/6684* (2013.01); *H01L 29/785* (2013.01); *H01L 29/7839* (2013.01); *H01L 29/66545* (2013.01)

(58) Field of Classification Search
CPC ............ H01L 27/11502–11514; H01L 27/11585–11597; H01L 29/516; H01L 27/0924; H01L 29/785; H01L 29/7839; H01L 29/16; H01L 29/511; H01L 29/401; H01L 29/40111; H01L 29/40114; G11C 11/223; G11C 11/221; G11C 5/02–05; G11C 5/06–10; G11C 5/14–148; G11C 11/4087; G11C 11/22; G11C 11/4074
See application file for complete search history.

(56) References Cited

U.S. PATENT DOCUMENTS

| | | | |
|---|---|---|---|
| 2004/0080340 A1* | 4/2004 | Hidaka | G11C 5/147 326/83 |
| 2004/0183508 A1* | 9/2004 | Toyoda | G11C 11/4087 323/265 |
| 2006/0091913 A1 | 5/2006 | Bhattacharya | |
| 2008/0012424 A1 | 1/2008 | Shin et al. | |
| 2016/0005749 A1 | 1/2016 | Li et al. | |
| 2016/0211849 A1 | 7/2016 | Shin et al. | |
| 2018/0076334 A1* | 3/2018 | Ando | H01L 21/28088 |
| 2019/0058049 A1* | 2/2019 | Then | H01L 29/6684 |
| 2019/0067206 A1 | 2/2019 | Bedeschi et al. | |

FOREIGN PATENT DOCUMENTS

| | | |
|---|---|---|
| KR | 10-2016-0040356 A | 4/2016 |
| KR | 10-2016-0089141 A | 7/2016 |
| TW | 201707374 A | 2/2017 |

OTHER PUBLICATIONS

Final Office Action issued in related U.S. Appl. No. 15/707,577, dated Aug. 6, 2019.

Non-Final Office Action issued in related U.S. Appl. No. 15/707,577, dated Dec. 27, 2018.

"Switching-Speed Limitations of Ferroelectric Negative-Capacitance FETs," Zhi Cheng Yuan, Shahriar Rizwan, Michael Wong, Kyle Holland, Sam Anderson, Terence B. Hook, Diego Kienle, Serag Gadelrab, Prasad S. Gudem, Mani Vaidyanathan, IEEE Trans. on Elect. Devices, vol. 63, No. 10, pp. 4046-4052 Oct. 2016 (Year: 2016).

Non-final Office Action issued in related U.S. Appl. No. 15/707,577, dated Feb. 12, 2020.

* cited by examiner

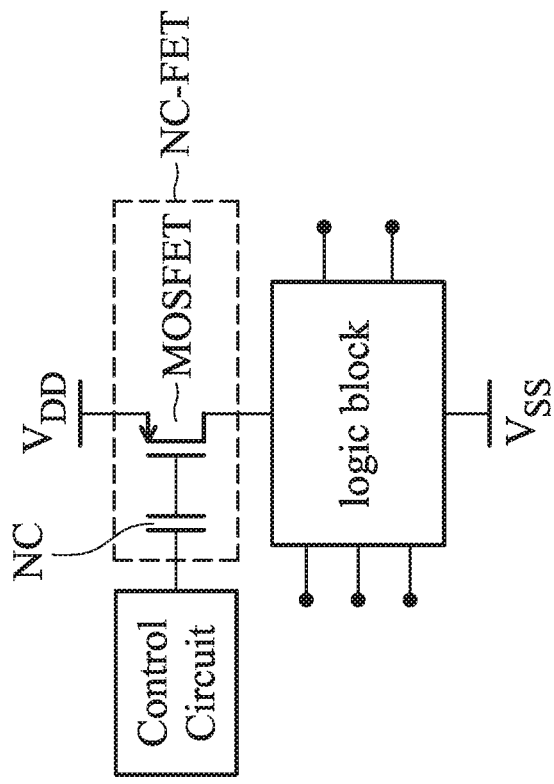
FIG. 1A
FIG. 1B
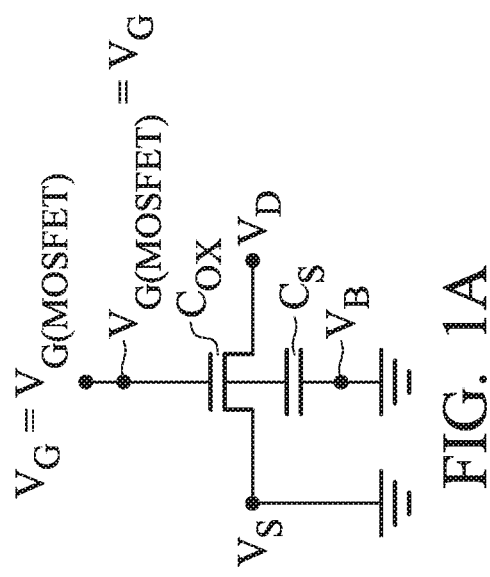
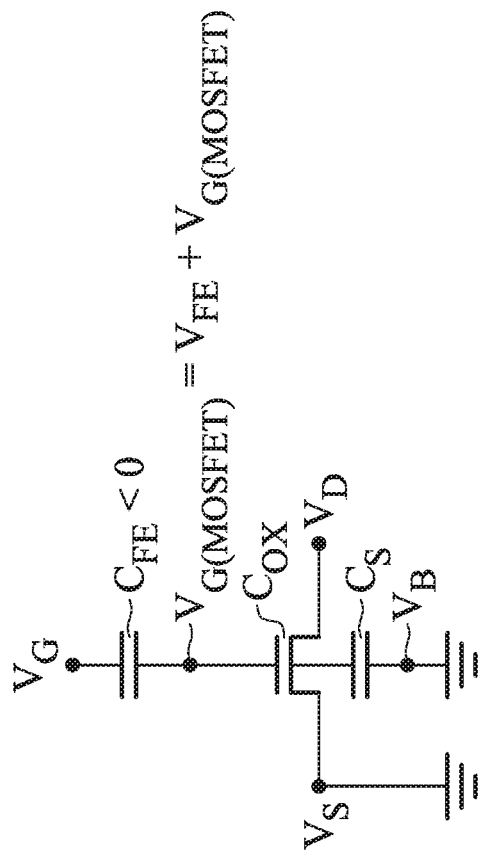
FIG. 1C

| Header transistor | P-MOSFET | | P-NC-FET | |
|---|---|---|---|---|
| | LVT | SVT | LVT | SVT |
| keep same switch area | | | | |
| $V_t$ | 1 | 1.24 | 0.64 | 0.82 |
| Subthreshold Swing | 1 | 1 | 0.83 | 0.83 |
| $R_{ON}$ | 1 | 1.85 | 0.35 | 0.45 |
| Standby leakage ($I_{OFF}$) | 1 | 0.09 | 1 | 0.09 |
| keep same $R_{ON}$ | | | | |
| Reduction on chip area (%) | 0% | +6.0% | -4.4% | -3.9% |
| Standby leakage ($I_{OFF}$) | 1 | 0.17 | 0.36 | 0.03 |

FIG. 2C

SEMICONDUCTOR DEVICE INCLUDING STANDARD CELLS WITH HEADER/FOOTER SWITCH INCLUDING NEGATIVE CAPACITANCE

RELATED APPLICATION

This application is a divisional of application Ser. No. 15/707,577 filed on Sep. 18, 2017, the entire contents of which are incorporated herein by reference.

TECHNICAL FIELD

The disclosure relates to semiconductor integrated circuits, and more particularly to semiconductor devices including negative capacitance field effect transistors (NC FETs).

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately logarithmic linear behavior in this metal-oxide-semiconductor (MOS) FET operating region. To improve the subthreshold properties, a negative capacitance field effect transistor (NC FET) using a ferroelectric material has been proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B show operations of a normal MOS FET and an NC FET. FIG. 1C illustrates a circuit diagram of a semiconductor device in accordance with embodiments of the present disclosure.

FIG. 2C shows comparison between a normal MOS FET and an NC FET.

DETAILED DESCRIPTION

Figure 2B:
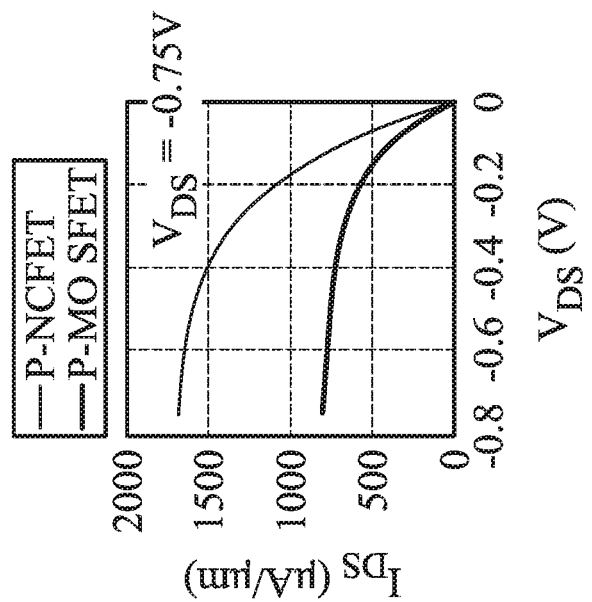
FIGS. 2A and 2B show electrical properties of a normal MOS FET and an NC FET.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Minimization of power consumption in a semiconductor device, such as an integrated circuit (IC), is a critical issue for semiconductor devices for high speed operations of and/or semiconductor device for mobile terminals. Various technologies to reduce the power consumption have been proposed, but many of them require a larger chip area due to additional circuitry for controlling power. One such technology includes adding a header switch and/or a footer switch between a power supply line(s) and a functional circuit. For example, a p-type MOS FET can be used as a header switch and an n-type MOS can be used as a footer switch to shut off the power supply to the functional circuit. The power consumption is reduced by turning-off the header/footer switch coupled to a non-active functional circuit in the semiconductor device.

In this disclosure, a header switch is a switch disposed between a first potential supply line (Vdd) and the functional circuit such as a logic circuit and/or a memory circuit. When the functional circuit includes an internal potential supply line (bus line), the header switch is disposed between the first potential supply line (Vdd) and the internal potential supply line. Similarly, a footer switch is a switch disposed between a second potential supply line ($V_{SS}$) and the functional circuit. When the functional circuit includes an internal potential supply line (bus line), the header switch is disposed between the second potential supply line ($V_{SS}$) (e.g., the ground) and the internal potential supply line.

The size (e.g., a device width) of the switching device is determined by a voltage drop of the switch device in the "ON" state, expressed by the relationship $\Delta V_{DD} = I_{ON} * R_{ON}$, where $I_{ON}$ is a required drive current for operating active functional circuitry and $R_{ON}$ is a linear resistance of the switching device. Based on the maximum allowed $\Delta V_{DD}$ and $I_{ON}$ requirement, a design specification of $R_{ON}$ is determined. If the $R_{ON}$ of the switching device is higher than the specification, the size of the switch device needs to be increased accordingly.

The other important device parameter is an off state leakage $I_{OFF}$, which determines the power consumption of the inactive circuitry. Typically, a high $V_t$ (threshold voltage) device is selected for the switching device to reduce the power consumption. However, a higher $V_t$ results in a higher on-resistance $R_{ON}$ due to a loss of the gate over-drive ($V_{DD} - V_t$), especially for the advanced low $V_{DD}$ technology nodes. Thus, there is a trade-off between the power consumption and chip area.

In the present embodiments, an NC FET is applied to the header and/or footer switches to control power supply to the functional circuitry.

FIGS. 1A and 1B show operations of a normal MOS FET and an NC FET. In an NC FET, a capacitor (e.g., a ferroelectric (FE) capacitor) showing a negative capacitance ($C_{FE} < 0$) is connected to a gate of a MOS FET in series. FIG. 1B shows a MIMIS FET-type NC FET.

In a normal MOS FET (without an FE capacitor), as shown in FIG. 1A, when an external voltage $V_G$ is applied, to the gate of the MOS FET, the voltage drop at the MOS FET $V_{G(MOS\ FET)}$ is equal to $V_G$. In contrast, as shown in FIG. 1B, in an NC FET, the voltage drops on the FE capacitor is defined as $V_{FE}$, and since the FE capacitor operates at a negative capacitance region, the voltage drop on the FE capacitor is opposite to an external bias, i.e., $V_{FE} = E_{FE} * t_{FE}$, where $t_{FE}$ is the thickness of the capacitor dielectric (a ferroelectric film), $V_{G(MOS\ FET)} = V_G + |V_{FE}|$, which is higher than $V_G$. In other words, the same external voltage $V_G$ is applied to the NC FET, and a higher gate voltage is effectively applied to the gate of the MOS FET portion of the NC FET. Accordingly, it is possible to reduce an off-leak current without increasing a $V_t$ of the MOS FET portion of the NC FET.

More details are explained below. The voltage amplification $A_V$ on the gate-terminal of the MOS FET portion in NC FET is expressed by Equation (1). The FE capacitor functions like a voltage amplifier and the drive current ($I_{DS}$) is enhanced.

$$A_V = \frac{\partial V_{G(MOSFET)}}{\partial V_G} = \frac{|C_{FE}|}{|C_{FE}| - C_{MOS}} \quad (1)$$

Assuming no hysteresis in the transfer characteristic ($I$–$V_G$) of the NC FET, as shown in Equation (2), $C_{MOS}$ must be smaller than $-C_{FE}$.

$$\frac{\partial V_G}{\partial Q} > 0 = > \frac{\partial V_G}{\partial Q} = \frac{\partial (V_{FE} + V_{MOS})}{\partial Q} = \frac{C_{MOS} + C_{FE}}{C_{MOS} \times C_{FE}} > 0 \quad (2)$$

For the MOS FET portion, the sub-threshold swing is expressed by equation (3), where $V_G$ is the applied gate bias, $\Psi_s$ is the surface potential, $C_s$ is the semiconductor capacitance, and $C_{ins}$ is equal to the gate insulator capacitance $C_{ox}$. The "$1 + C_s/C_{ins}$" is larger than 1, and therefore the limit Swing dictated by Boltzmann distribution is about 60 mV/dec at room temperature.

$$Swing = \frac{\partial V_G}{\partial (\log_{10} I)} = \frac{\partial V_G}{\partial \psi_s} \frac{\partial \psi_s}{\partial (\log_{10} I)} \cong \left(1 + \frac{C_s}{C_{ins}}\right)\left(\frac{kT}{q} \ln 10\right) \quad (3)$$

For the NC FET, the $C_{ins}$ can be expressed by equation (4).

$$C_{ins} = \frac{C_{ox} \times C_{FE}}{C_{ox} + C_{FE}} \quad (4)$$

When $C_{ox}$ is larger than $-C_{FE}$, $C_{ins} < 0$ is achieved. The sub-threshold swing becomes smaller than 60 mV/dec. The sub-threshold voltage ($V_t$) is lowered to get the larger gate overdrive bias ($V_{DD} - V_t$). Similar analysis can be applied to MIS FET type NC FETs.

Figure 2A:
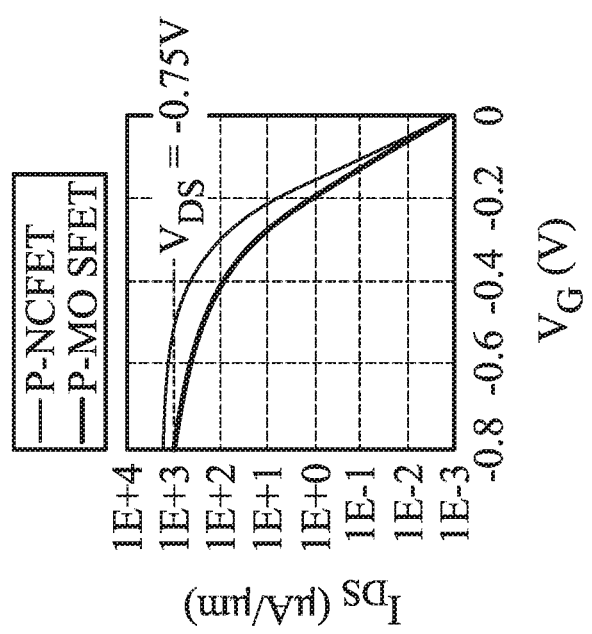

FIG. 2A shows transfer characteristics $I_{DS}$–$V_G$ for a normal p-type MOS FET and a p-type NC FET, where the $I_{OFF}$ is shifted by the same amount. The p-type NC FET shows a smaller sub-threshold swing (S.S.) and a larger drive current at the same $V_G$ than the normal p-type MOS FET. FIG. 2B shows $I_{DS}$–$V_{DS}$ characteristics with $V_G = 0.75V$. At the linear-region, the NC FET has a smaller linear resistance than the normal MOS FET.

FIG. 2C shows analytical comparison between a normal MOS FET and an NC FET when used as a header switch. Two types of transistors, a low threshold voltage (LVT) transistor and a standard threshold voltage (SVT) transistor, having a higher threshold voltage than the LVT transistor are employed in the analysis for a normal MOS FET and an NC FET, respectively. The normal MOS FET and the NC FET are both p-type. For the NC FET, the parameters of the ferroelectric (FE) capacitor are remnant polarization $P_r = 5$ uC/cm$^2$; a coercive field $E_c = 1$ MV/cm; and a ferroelectric dielectric layer thickness $t_{FE} = 2.5$ nm. The analysis is performed for the case that a critical lower drive voltage $V_{DD} = 0.5V$. In the tables of FIG. 2C, the results are indicated as relative values with respect to values for a normal LVT MOS FET.

The upper table of FIG. 2C shows the results when the same device areas are applied to all four transistors, while the lower table of FIG. 2C shows the results to maintain the same on-resistance RON.

When a SVT MOS FET is employed for a header switch, while lower standby leakage current can be achieved, the on-resistance increases 1.85 time that of the LVT MOS FET when the same device area is maintained. To achieve the same $R_{ON}$, the device area for the SVT MOS FET increases 6% from the device area of the LVT MOS FET. In other words, it is difficult for normal MOS FET to achieve a lower standby leakage current, a lower on-resistance and a smaller device area at the same time.

In contrast, when NC FETs are employed, lower $V_t$, $R_{ON}$ and subthreshold swing than normal MOS FETs can be achieved. That is, a larger drive current can be applied on the functional circuitry to enhance its operational speed. When the same on-resistance is maintained, NC FETs can reduce the device area about 63% and 55% than the LVT MOS FET and the SVT MOS FET, respectively, which results in the reduction of the total chip area of 4.4% and 3.9%, respectively. More importantly, the standby leakage current on the LVT/SVT NC FETs are reduced to from about 0.36 time to about 0.03 times that of the LVT MOS FET. Thus, an NC FET can achieve a lower standby leakage current, a lower on-resistance and a smaller device area at the same time.

In the present disclosure, an NC FET is used as a header switch and/or a footer switch as shown in FIG. 1C. FIG. 1C shows an embodiment of a header switch configured by an NC FET. A gate of the NC FET is coupled to a control circuit, and by a control signal from the control circuit, the header switch turns on and off the power supply from the potential supply line ($V_{DD}$). As set forth above, even if the control signal has the same amplitude as $V_G$, which is the same amplitude applied to the functional circuitry (e.g., "logic block"), the effective gate voltage applied to a MOS FET portion of the NC FET becomes higher. When tuning off the NC FET, a zero voltage or a voltage having an opposite polarity to $V_G$ is applied to the gate of the NC FET to erase remaining polarization of the ferroelectric material layer.

The ferroelectric negative capacitor NC of FIG. 1C can be a separate capacitor connected by a conductive layer (e.g., wire/contact) to the gate of the MOS FET, in some embodiments. In such a case, the negative capacitor has a first terminal (electrode) and a second terminal (electrode), and the first terminal is connected by a conductive element (e.g., wire) to a gate of the MOS FET. In other embodiments, one of the terminals of the negative capacitor NC is a gate electrode of the MOS FET. In such a case, the negative capacitor is formed within sidewall spacers of the MOS FET.

Figure 3A:
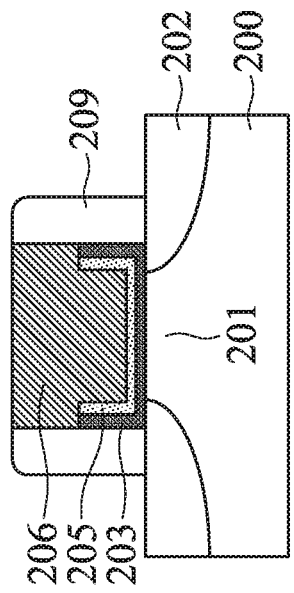
FIG. 3A shows a cross sectional view of a metal-insulator-metal-insulator-semiconductor (MIMIS) FET-type NC FET and FIGS. 3B and 3C show cross sectional views of metal-insulator-semiconductor (MIS) FET-type NC FETs.
Figure 3B:
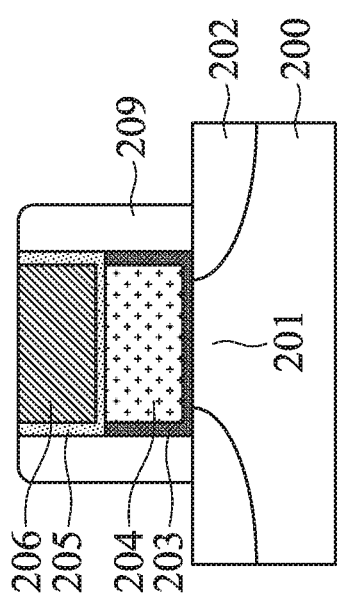
Figure 3C:
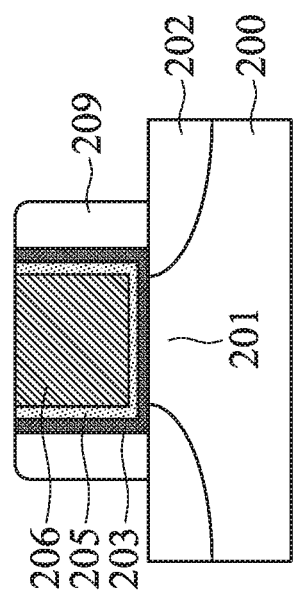

There are two types of NC FETs. FIG. 3A shows a cross sectional view of a metal-insulator-metal-insulator-semiconductor (MIMIS) FET-type NC FET and FIGS. 3B and 3C show cross sectional views of metal-insulator-semiconductor (MIS) FET-type NC FETs. Although FIGS. 3A-3C show NC FETs of a planar MOS transistor structure, fin FETs and/or gate-all-around FETs can be employed.

As shown in FIG. 3A, an MIMIS NC FET includes a substrate 200, a channel 201 and source and drain 202. The source and drain 202 are appropriately doped with impurities. Further, the source and drain and the channel (active regions) are surrounded by an isolation insulating layer, such as shallow trench isolation (STI), made of, for example, silicon oxide.

A first gate dielectric layer 203 is disposed over the channel 201. The first gate dielectric layer 203 includes one or more high-k dielectric layers (e.g., having a dielectric constant greater than 3.9) in some embodiments. For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN ($Si_3N_4$), $Al_2O_3$, $La_2O_3$, $Ta_2O_3$, $Y_2O_3$, $HfO_2$, $ZrO_2$, $GeO_2$, $Hf_xZr_{1-x}O_2$, $Ga_2O_3$, $Gd_2O_3$, $TaSiO_2$, $TiO_2$, HfSiON, $YGe_xO_y$, $YSi_xO_y$, and $LaAlO_3$, and the like. In certain embodiments, $HfO_2$, $ZrO_2$ and/or $Hf_xZr_{1-x}O_2$ is used. The formation methods of first gate dielectric layer 203 include molecular-beam deposition (MBD), atomic layer deposition (ALD), physical vapor deposition (PVD), chemical vapor deposition (CVD), and the like. In some embodiments, the first gate dielectric layer 203 has a thickness of about 1.0 nm to about 5.0 nm.

In some embodiments, an interfacial layer (not shown) may be formed over the channels 201 prior to forming the first gate dielectric layer 203, and the first gate dielectric layer 203 is formed over the interfacial layer. The interfacial layer helps buffer the subsequently formed high-k dielectric layer from the underlying semiconductor material. In some embodiments, the interfacial layer is a silicon oxide, which may be formed by chemical reactions. For example, a chemical silicon oxide may be formed using deionized water+ozone ($DIO_3$), $NH_4OH+H_2O_2+H_2O$ (APM), or other methods. Other embodiments may utilize a different material or processes for the interfacial layer. In some embodiments, the interfacial layer has a thickness of about 0.5 nm to about 1.5 nm.

A first gate electrode 204 as an internal electrode is disposed on the first gate dielectric layer 203. The first gate electrode 204 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. In some embodiments, the first gate electrode 204 includes a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides, such as $WN_x$, $TiN_x$, $MoN_x$, $TaN_x$, and $TaSi_xN_y$, may be used. In some embodiments, at least one of W, Ti, Ta, TaN and TiN is used as the first gate electrode 204.

In some embodiments, the first gate electrode 204 includes a work function adjustment metal (WFM) layer (not shown) formed over the first gate dielectric layer 203, and a main electrode layer. The WFM layer includes one or more layers of conductive material, such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

A second gate dielectric layer 205, which is made of a ferroelectric material, is formed on the first gate electrode 204. The second gate dielectric layer (ferroelectric material layer) 205 includes one or more materials selected from the group consisting of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_2$, hafnium silicate, HfAlO, LaAlO, lanthanum oxide, $HfO_2$ doped with Si ($HfSiO_x$), and $Ta_2O_5$. In some embodiments, $HfO_2$ doped with Si, Al and/or Zr or $ZrO_2$ doped with Si and/or Al is used as the second gate dielectric layer 205.

The thickness of the second gate dielectric layer 205 is in a range from about 1.0 nm to about 10 nm in some embodiments, and may be formed by a suitable process such as ALD or CVD. As shown in FIG. 3A, the second gate dielectric layer 205 is conformally formed in some embodiments.

Further, a second gate electrode 206 as an external gate is disposed on the second gate dielectric layer 205. The second gate electrode 206 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. The second gate electrode 206 is made of the same material as or different material from the first gate electrode 204. Further, sidewall spacers 209 are formed on opposing side faces of the gate structure as shown in FIG. 3A. The sidewall spacers 209 include one or more layers of insulating material, such as silicon oxide, silicon nitride and silicon oxynitride.

The channel 201, the gate dielectric layer 203 and the first gate electrode 204 constitute a MOS (metal-oxide-semiconductor) structure and the first gate electrode 204, the ferroelectric layer 205 and the second gate electrode 206 constitute a MIM (metal-insulator-metal) structure.

As shown in FIG. 3B, an MIS NC FET includes a substrate 200, a channel 201 and source and drain 202. Unlike the MIMIS NC FET, an internal gate electrode 204 is missing and the ferroelectric material layer 205 is formed on the first gate dielectric layer 203.

As shown in FIGS. 3A and 3B, the first gate dielectric layer 203 and the second gate dielectric layer 205 have a "U-shape" in the cross section, having a thin center portion and thick side portions. In other embodiments, as shown in FIG. 3C, the first gate dielectric layer 203 and the ferroelectric material layer 205 vertically extend to substantially the same level as the upper surface of the gate electrode 206.

FIGS. 4A-5C show manufacturing operations for an NC-FinFET in accordance with some embodiments of the present disclosure. Throughout the various views and illustrative embodiments, like reference numbers are used to designate like elements. It is understood that additional operations can be provided before, during, and after processes shown by FIGS. 4A-5C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 3A-3C may be employed in the following embodiments, and detailed explanation thereof may be omitted.

Figure 4B:
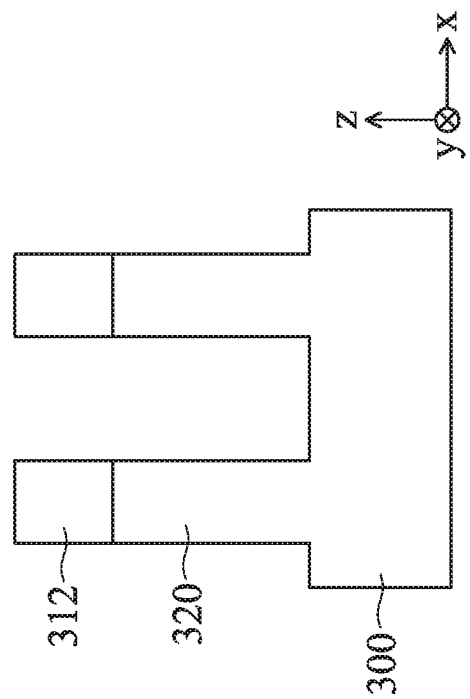
FIGS. 4A, 4B, 4C and 4D show manufacturing operations for an NC FET in accordance with an embodiment of the present disclosure.
Figure 4A:
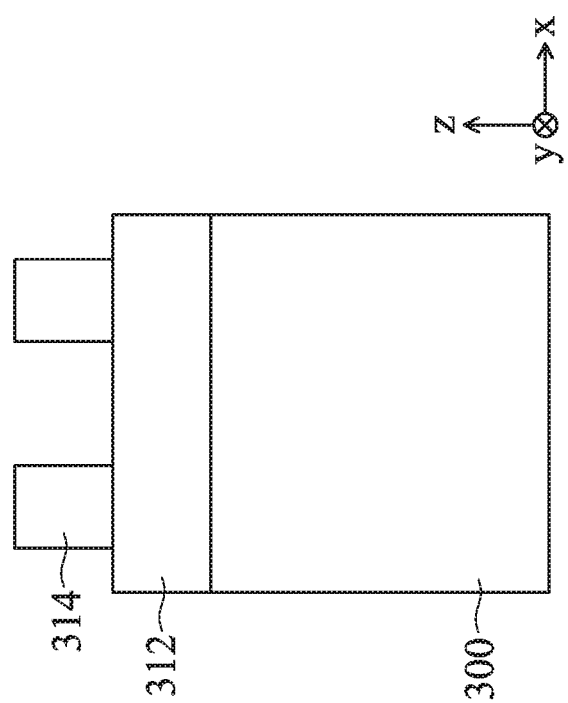

As show in FIG. 4A, a hard mask layer 312 is formed over a substrate 300, and a resist pattern 314 is formed on the hard mask layer 312. The hard mask layer 312 includes one or more layers of insulating material, such as silicon oxide and silicon nitride. In some embodiments, the substrate 300 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide(GaInP)), or the like. Further, the substrate 300 may include an epitaxial layer (epi-layer), which may be strained for performance enhancement, and/or may include a silicon-on-insulator (SOI) structure.

By using the resist pattern as an etching mask, the hard mask layer 312' is patterned into hard mask pattern 312, and then by using the hard mask pattern 312 as an etching mask, the substrate 300 is patterned into fin structures 320, as shown in FIG. 4B.

Then, isolation regions 325, such as shallow trench isolations (STI), are formed between the fin structures 320. The isolation insulating layer 325 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 325 is formed through a process such as CVD, flowable CVD (FCVD), or a spin-on-glass process, although any acceptable process may be utilized. Subsequently, portions of the isolation insulating layer 325 extending over the top surfaces of the fin structures 320, and the mask pattern 312 are removed using, for example, an etch process, chemical mechanical polishing (CMP), or the like. Further, the isolation insulating layer 325 are recessed so that the upper portions of the fin structures 320 are exposed, as shown in FIG. 4C.

Figure 4D:
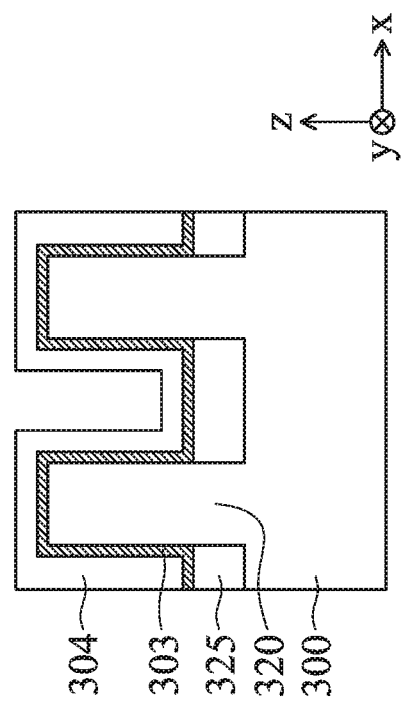
Figure 4C:
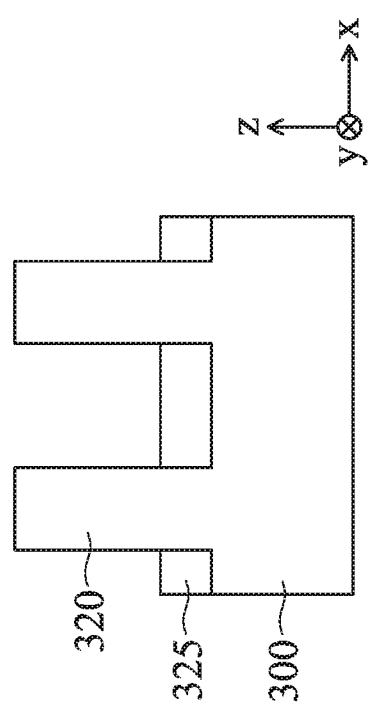

Subsequently, a first gate dielectric layer 303 is formed over the upper portions of the fin structure 320, and a first gate electrode 304 is formed over the first gate dielectric layer 303, as shown in FIG. 4D.

Figure 5A:
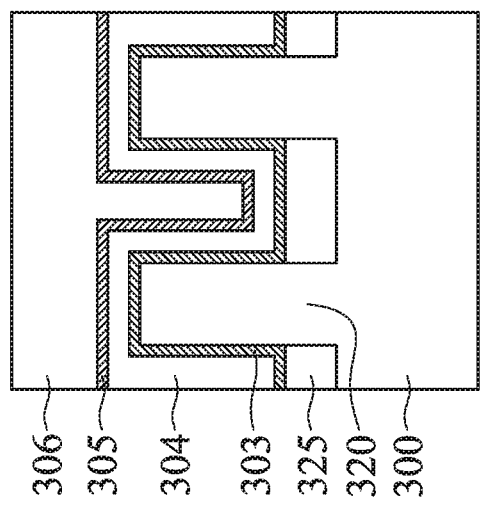
FIGS. 5A, 5B and 5C show various views of an NC FET in accordance with an embodiment of the present disclosure.
Figure 5C:
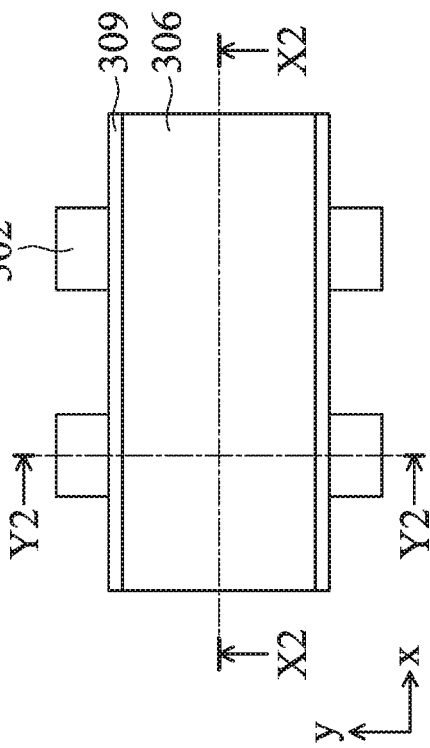
Figure 5B:
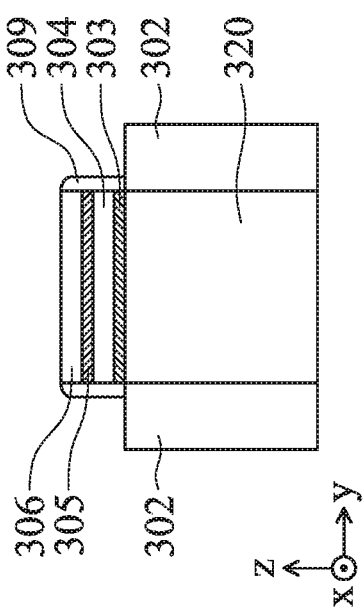

Further, as shown in FIGS. 5A-5C, the second gate dielectric layer 305 (ferroelectric layer), the second gate electrode 306, and source/drain regions 302 are formed. Further, sidewall spacer layers 309 are formed. FIG. 5A is a cross sectional view along the line X2-X2 of FIG. 5C and FIG. 5B is a cross sectional view along the line Y2-Y2 of FIG. 5C.

FIGS. 6A-7D show other manufacturing operations for an NC FinFET in accordance with some embodiments of the present disclosure. Throughout the various views and illustrative embodiments, like reference numbers are used to designate like elements. It is understood that additional operations can be provided before, during, and after processes shown by FIGS. 6A-7D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 3A-5C may be employed in the following embodiments, and detailed explanation thereof may be omitted.

In this embodiment, a gate replacement technology is employed.

Figure 6A:
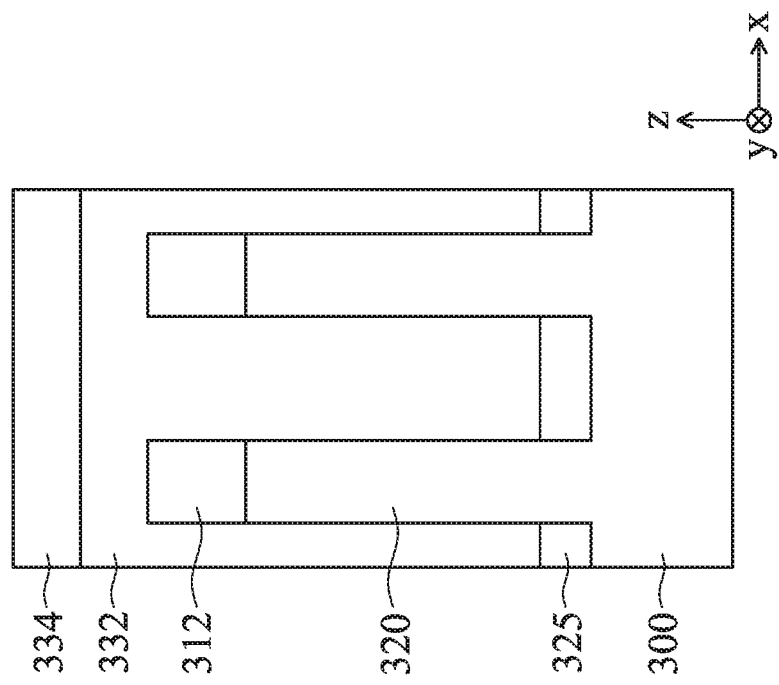
FIGS. 6A, 6B, 6C and 6D show manufacturing operations for an NC FET in accordance with an embodiment of the present disclosure.

As shown in FIG. 6A, the fin structures 320 are patterned by using the hard mask pattern 312, and the isolation insulating layer 325 are formed.

Figure 6B:
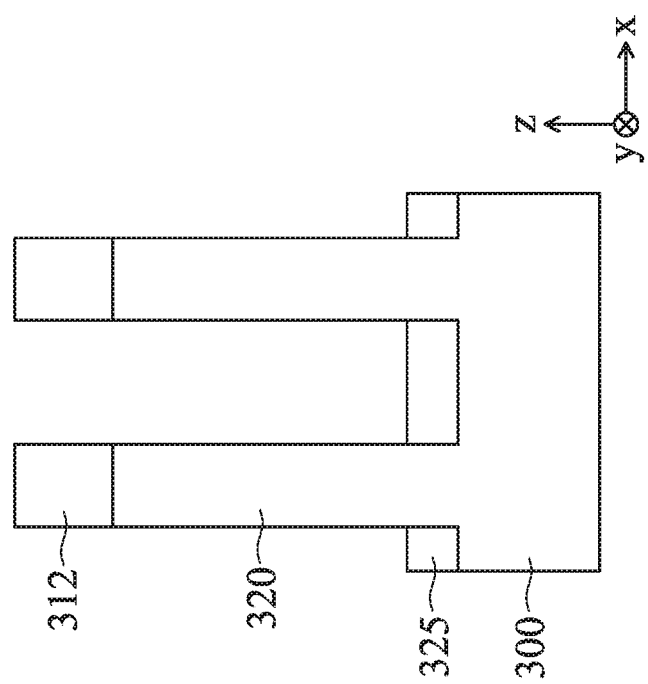

Then, a dummy gate dielectric layer (not shown) and a polysilicon layer 332 are formed over the fin structures 320, and further a hard mask pattern 334 is formed on the polysilicon layer 332, as shown in FIG. 6B. The hard mask pattern 324 includes one or more layers of insulating material, such as silicon oxide and silicon nitride.

By using the hard mask pattern 334 as an etching mask, the polysilicon layer 332 is patterned into a dummy gate electrode 332. Further, sidewall spacers 336 are formed on opposing side faces of the dummy gate electrode 332, and an interlayer dielectric layer 342 is formed, as shown in FIG. 6C. The sidewall spacers 336 include one or more layers of insulating material, such as silicon oxide, silicon nitride and silicon oxynitride, and the interlayer dielectric layer 342 includes one or more layers of insulating material such as silicon oxide based material such as silicon dioxide ($SiO_2$) and SiON. The material of the sidewall spacers 333 and the material of the interlayer dielectric layer 342 are different from each other, so that each of these layers can be selectively etched. In one embodiment, the sidewall spacer 333 is made of SiOCN, SiCN or SiON and the interlayer dielectric layer 342 is made of $SiO_2$.

Figure 6D:
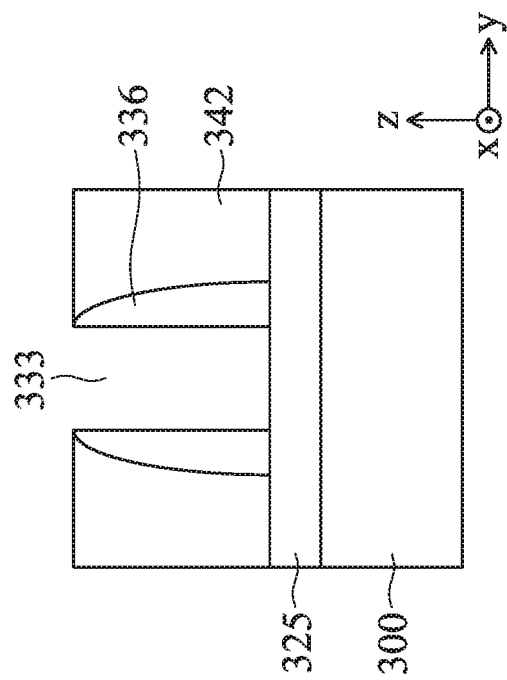
Figure 6C:
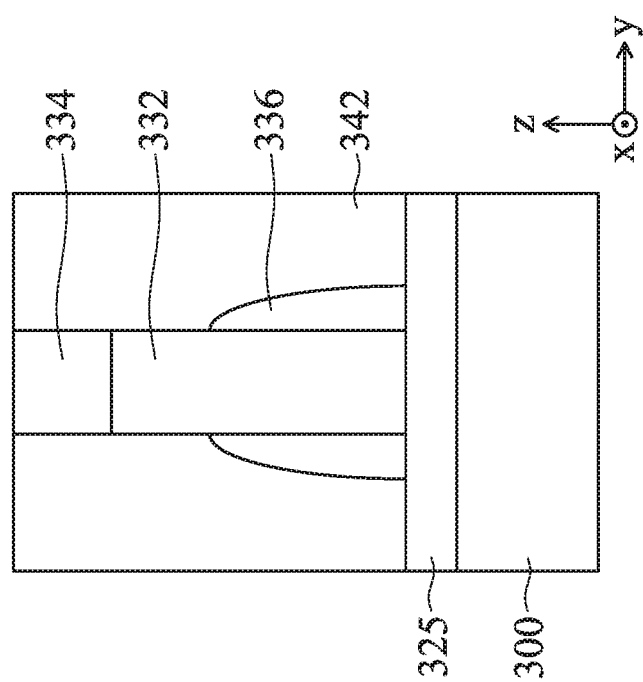

Then, the dummy gate electrode 332 and the dummy gate dielectric layer are removed by using dry and/or wet etching, thereby forming a gate space 333, as shown in FIG. 6D.

Figure 7B:
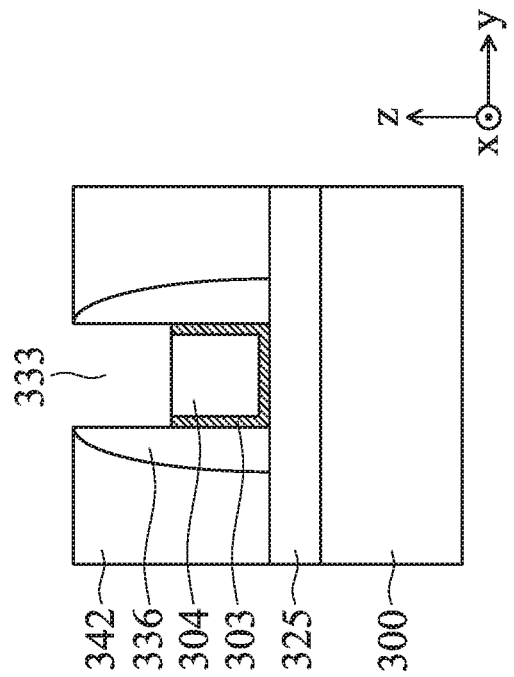
FIGS. 7A, 7B, 7C and 7D show manufacturing operations for an NC FET in accordance with an embodiment of the present disclosure.
Figure 7A:
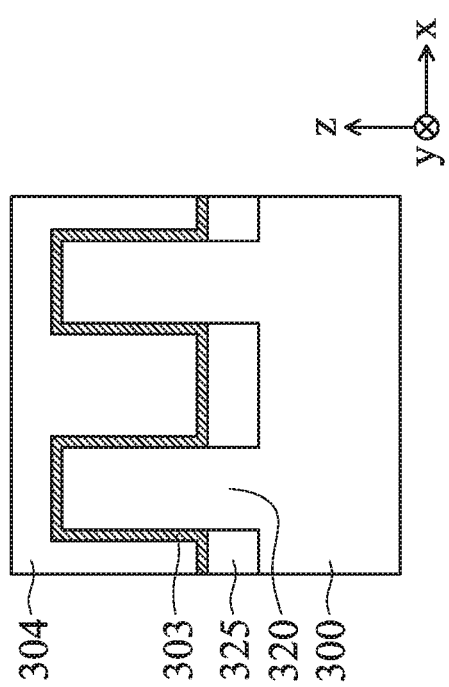

In the gate space, a first gate dielectric layer 303 and a first gate electrode 304 are formed as shown in FIGS. 7A and 7B. After the conductive material is formed over the first gate dielectric layer 303, a planarization operation, such as CMP, is performed to form the first gate electrode 304. The first gate dielectric layer 303 is made of, for example, a high-k dielectric material, and the first gate electrode 304 is made of, for example, a conductive material such as TiN or other metal material. Further, an etch-back operation is performed to reduce the height of the first gate dielectric layer 303 and the first gate electrode 304. The conductive material may be formed using a suitable process such as ALD, CVD, PVD, plating, or combinations thereof.

Figure 7D:
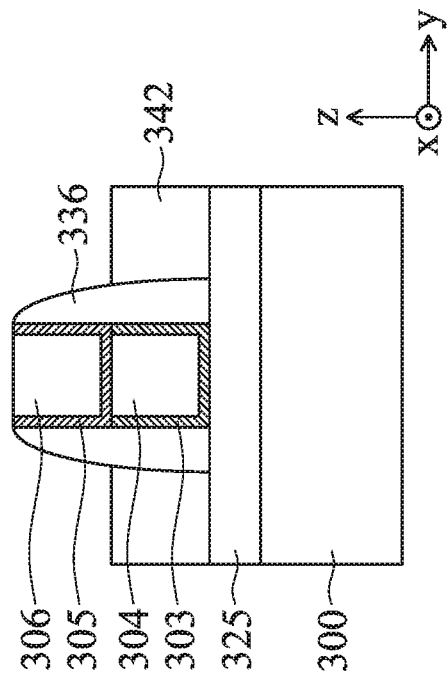
Figure 7C:
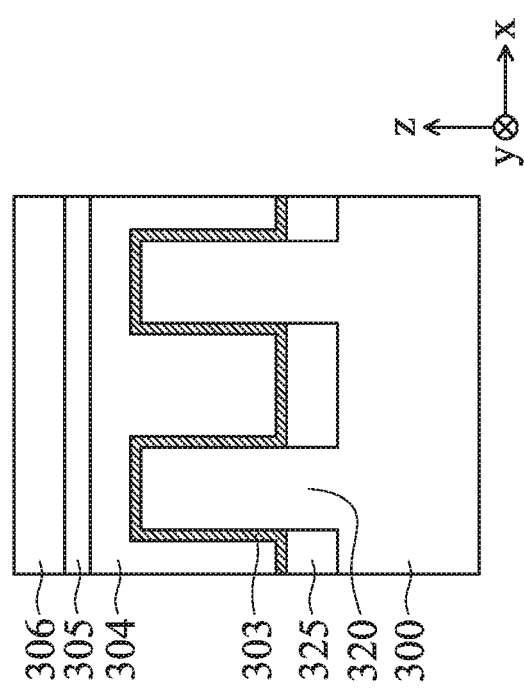

Then, a second gate dielectric layer 305 and a second gate electrode 306 are formed in the gate space 333, as shown in FIGS. 7C and 7D. A ferroelectric material layer 305 is conformally formed and a conductive material is formed over the ferroelectric material layer 303. After the conductive material is formed over the ferroelectric material layer (second gate dielectric layer) 305, a planarization operation, such as CMP, is performed to form the second gate electrode 306, as show in FIGS. 7C and 7D.

FIGS. 8A-8D show manufacturing operations for an MIS type NC FinFET in accordance with some embodiments of the present disclosure. Throughout the various views and illustrative embodiments, like reference numbers are used to designate like elements. It is understood that additional operations can be provided before, during, and after processes shown by FIGS. 8A-8D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 3A-7D may be employed in the following embodiments, and detailed explanation thereof may be omitted.

Figure 8B:
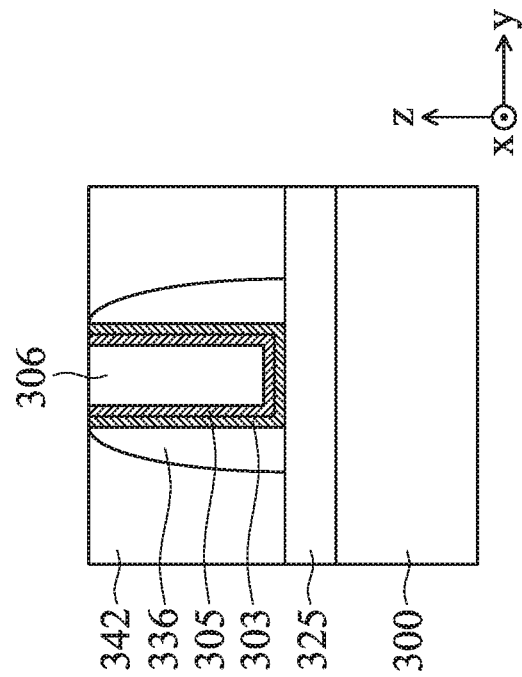
FIGS. 8A, 8B, 8C and 8D show manufacturing operations for an NC FET in accordance with an embodiment of the present disclosure.
Figure 8A:
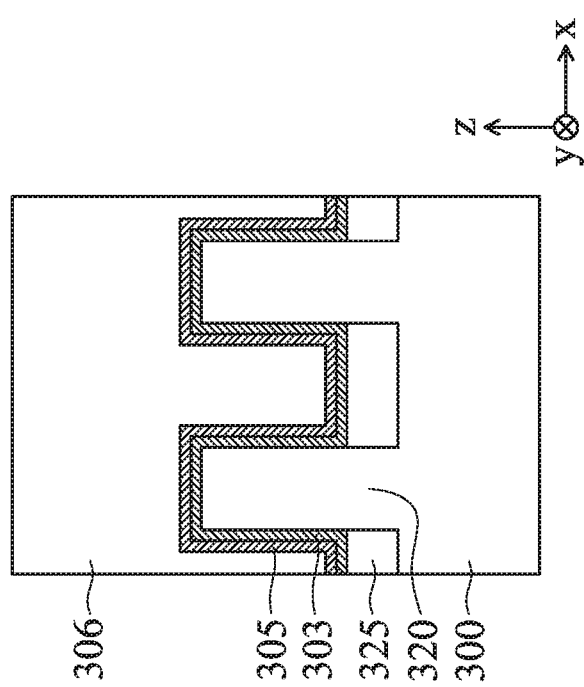
Figure 8D:
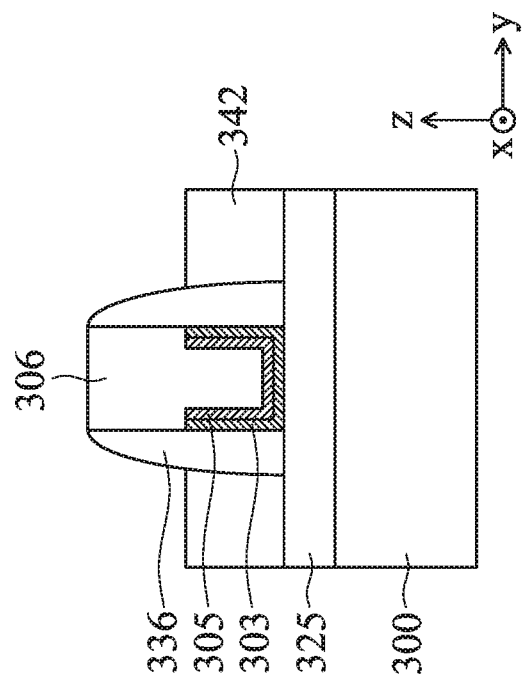
Figure 8C:
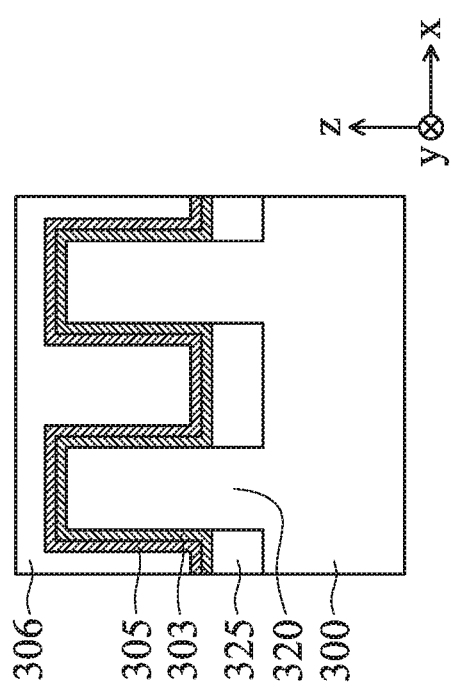

After the gate space 333 is formed as shown in FIG. 6D, a first gate dielectric layer 303 and the second gate dielectric layer (ferroelectric material layer) 305 are conformally formed in the gate space as shown in FIGS. 8A and 8B. Then, a conductive material is formed over the second gate dielectric layer 303, a planarization operation, such as CMP, is performed to form the second gate electrode 306, thereby forming an MIS NC FET corresponding to FIG. 3C. Then, an etch-back operation is performed to reduce the height of the second gate electrode 306, the second gate dielectric layer 305 and the first gate dielectric layer 303. Then, an additional conductive material is formed over the second gate dielectric layer 303, a planarization operation, such as CMP, is performed to form the second gate electrode 306, thereby forming an MIS NC FET corresponding to FIG. 3B.

Other method and structures for manufacturing MIMIS NC FETs are described in U.S. patent application Ser. Nos. 15/476,221 and 15/447,479, the entire contents of each of which are incorporated herein by reference.

In some embodiments of a method of manufacturing an NC FET, a first gate dielectric layer is formed on the channel, a first gate electrode is formed on the first gate dielectric layer, a second gate dielectric layer made of a ferroelectric material is formed on the first gate electrode, and a second gate electrode is formed on the second gate dielectric layer. The second gate dielectric layer is patterned so that a first area of a bottom surface of the first gate electrode, which is in contact with the first gate dielectric layer, is greater than a second area of a bottom surface of the second gate dielectric layer, which is in contact with the first gate electrode.

In other embodiments of a method of manufacturing an NC FET, a FinFET structure having a fin structure including a channel region and a dummy gate structure disposed over the channel region is formed. The dummy gate structure is then removed, thereby forming a gate space. A first gate dielectric layer is formed in the gate space over the channel region. A first gate electrode layer is formed over the first gate dielectric layer. The first gate dielectric layer and the first gate electrode layer are recessed, thereby forming a recessed gate space. Then, a second gate dielectric layer (a ferroelectric material layer) is formed on the recessed gate dielectric layer and first gate electrode layer in the recessed gate space. Then, a second gate electrode layer is formed on the second gate dielectric layer. When the first gate electrode layer is formed, a first conductive layer (e.g., WFM layer) is formed over the first gate dielectric layer and a second conductive layer is disposed over the first conductive layer.

Figure 9A:
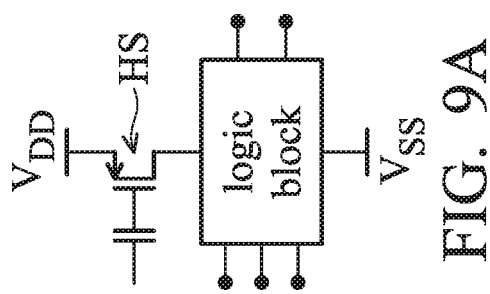
FIGS. 9A, 9B, 9C, 9D, 9E and 9F show circuit diagrams according to embodiments of the present disclosure.
Figure 9B:
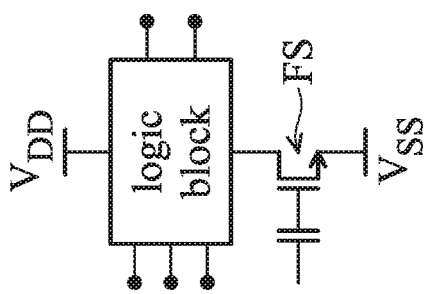
Figure 9C:
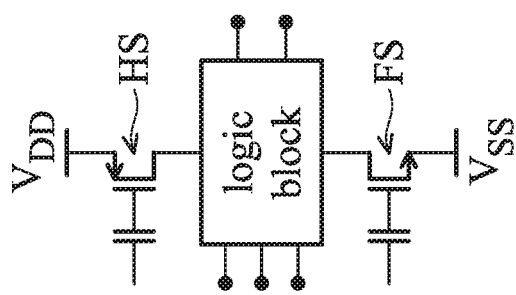
Figure 9D:
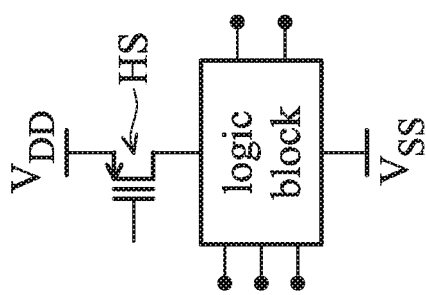
Figure 9E:
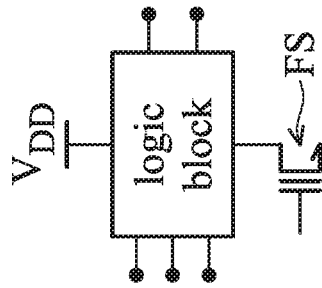
Figure 9F:
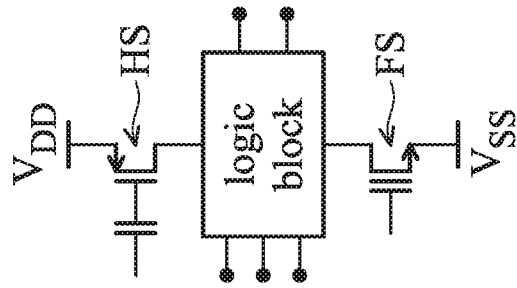

FIGS. 9A, 9B and 9C show circuit diagrams using an MIMIS type NC FET according to embodiments of the present disclosure, and FIGS. 9D, 9E and 9F show circuit diagrams using an MIS type NC FET according to embodiments of the present disclosure.

In FIGS. 9A and 9D, an MIMIS type NC FET or an MIS type NC FET is used as a header switch HS. As the header switch, a p-type NC FET is used in some embodiments. In FIGS. 9B and 9E, an MIMIS type NC FET or an MIS type NC FET is used as a footer switch FS. As the footer switch, an n-type NC FET is used in some embodiments. FIGS. 9C and 9F show embodiments in which both header switch HS and footer switch FS are configured by an MIMIS type NC FET or an MIS type NC FET.

Figure 10B:
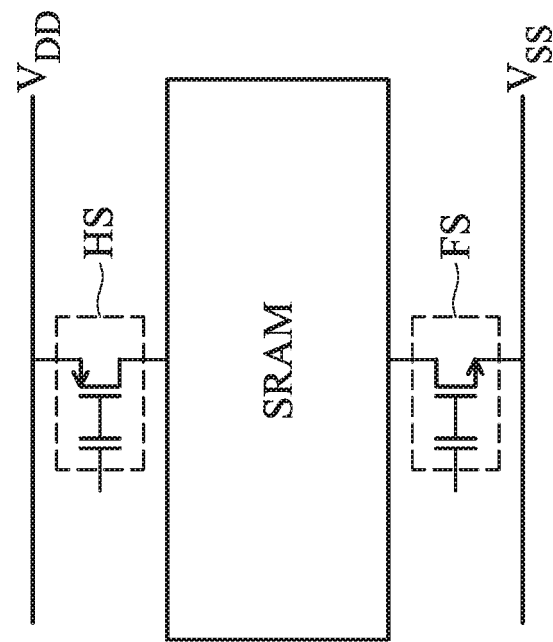
FIGS. 10A and 10B show circuit diagrams according to embodiments of the present disclosure.
Figure 10A:
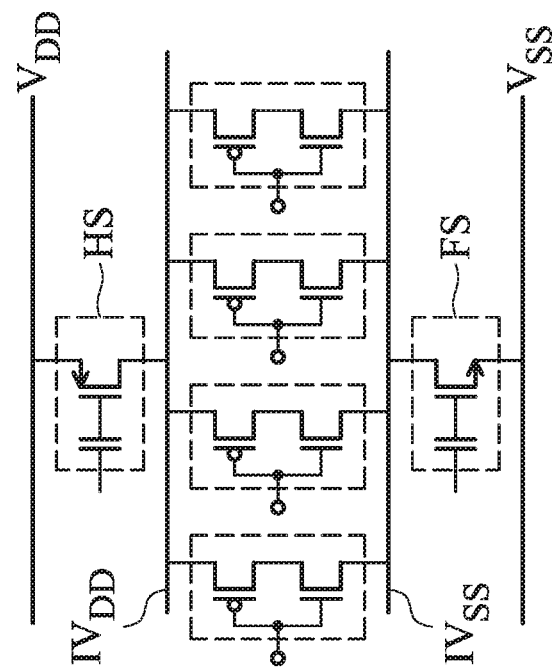

FIGS. 10A and 10B show circuit diagrams according to embodiments of the present disclosure.

FIG. 10A shows an embodiment, in which the functional circuit is a logic circuit including four inverter circuits. The number of the invertors is a just an example, and is not limited to four. In some embodiments, sources of p-type MOS FETs of the invertor circuits are coupled to an internal potential supply line $IV_{DD}$ and the header switch (NC FET) is disposed between the internal potential supply line $IV_{DD}$ and the first potential supply line $V_{DD}$. Similarly, drains of n-type MOS FETs of the invertor circuits are coupled to an internal potential supply line $IV_{SS}$ and the footer switch (NC FET) is disposed between the internal potential supply line $IV_{SS}$ and the second potential supply line $V_{SS}$. Any other logic circuits, such as AND, NAND, OR or NOR, or more complicated logic circuits can be utilized as the functional circuit.

FIG. 10B is an embodiment, in which the functional circuit is a memory circuit, such as a static random access memory (SRAM). In the SRAM, internal potential supply lines are provided and the header and/or footer switches are provided between the first/second potential supply lines ($V_{DD}$ and/or $V_{SS}$) and the respective internal potential supply lines.

Figure 11A:
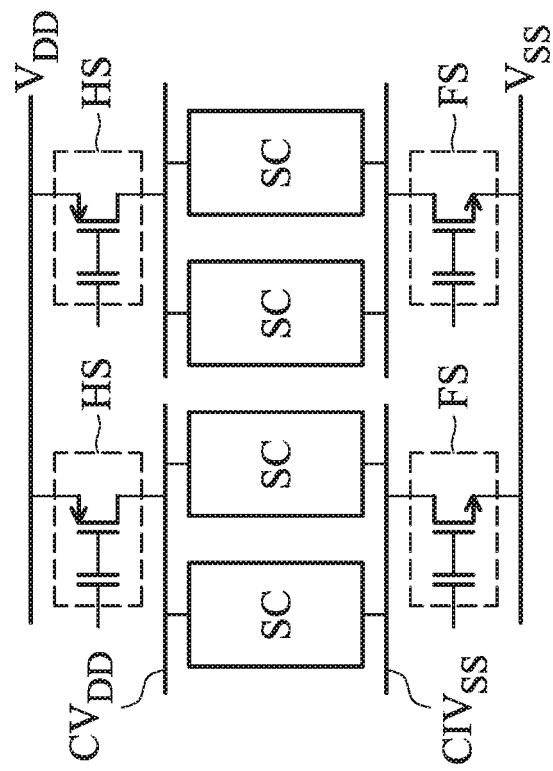
FIGS. 11A and 11B show circuit diagrams according to embodiments of the present disclosure.
Figure 11B:
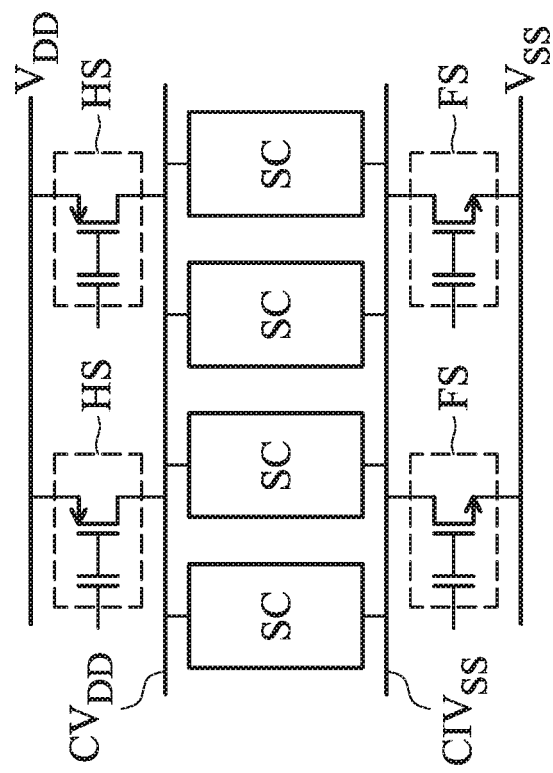

FIGS. 11A and 11B show circuit diagrams according to embodiments of the present disclosure.

In FIGS. 11A and 11B, standard cells SC are employed as functional circuitry. In FIG. 11A, two header switches HS are disposed between a common potential supply line $CV_{DD}$ and the first potential supply line $V_{DD}$ and/or two footer switches FS are disposed between a common potential supply line $CV_{SS}$ and the second potential supply line $V_{SS}$, where four standard cells are coupled to the common potential supply line $CV_{DD}$ and the common potential supply line $CV_{SS}$. Depending on the required current capacity, the number of header/footer switches is adjusted. In FIG. 11B, two header switches HS and two footer switches FS are provided for two groups of standard cells SC. In FIG. 11B, by selectively controlling header/footer switches, it is possible to selectively activate and/or deactivate a group of standard cells.

The functional circuitry includes a plurality of normal MOS FETs. Some of the physical and/or electrical parameters of such MOS FETs in functional circuitry are substantially the same as those of the MOS FET portion of the NC FET. For example, the MOS FETs of the functional circuit have the same gate length as the NC FET of the header and/or footer switch in some embodiments. In other embodiments, the MOS FETs of the functional circuit have the same gate dielectric layer (first gate dielectric layer) thickness as the NC FET of the header and/or footer switch. Further, source/drain dopant concentrations are the same between the MOS FETs and the NC FETs. Here, the same or substantially same mean that the subject layer/structure is formed by the same operation at the same time, allowing for process variations.

Further, a semiconductor device includes multiple threshold voltage (Vth) transistors, for example, an n-channel low threshold voltage (N-LVT) FET, an n-channel standard threshold voltage (N-SVT) FET, a p-channel standard threshold voltage (P-SVT) FET and a p-channel low threshold voltage (P-LVT) FET, which are fabricated with different work-function adjustment metal (WFM) thicknesses. When the functional circuit (e.g., standard cells) is formed by n-channel low threshold voltage FETs and p-channel low threshold voltage FETs, the structures of the MOS FET portions of the NC FET for the header and/or footer switch are the same as the structures of the n-channel low threshold voltage FETs and the p-channel low threshold voltage FETs.

It will be understood that not all advantages have been necessarily discussed herein, no particular advantage is required for all embodiments or examples, and other embodiments or examples may offer different advantages.

For example, in the present disclosure, an NC FET is used for a header switch and/or a footer switch for turning on/off power supply from the potential supply line(s) ($V_{DD}$ and/or $V_{SS}$). Since the voltage applied to a gate of the MOS FET portion of the NC FET becomes higher because of the negative capacitance effect of negative capacitor connected to the gate, it is possible to effectively form a high-threshold voltage switch transistor as a header and/or footer switch. Accordingly, it is possible to reduce an off-leakage current (standby current) when the header and/or footer switch is turned off. Further, since the basic structures of the MOS FET portion of the NC FET are substantially the same as the structures of normal MOS FETs disposed around the NC FET, it is possible to minimize the number of process steps. In addition, it is possible to suppress the chip area from increasing.

In accordance with an aspect of the present disclosure, a semiconductor device includes a first potential supply line for supplying a first potential, a second potential supply line for supplying a second potential lower than the first potential, a functional circuit, and a switch disposed between the first potential supply line and the functional circuit. The switch includes a MOS FET and a negative capacitor showing a negative capacitance and having a first terminal and a second terminal, and the first terminal is electrically coupled to a gate of the MOS FET. In one or more of the foregoing and/or following embodiments, the first terminal of the negative capacitor is a gate electrode of the MOS FET. In one or more of the foregoing and/or following embodiments, the negative capacitor further includes a capacitor dielectric layer disposed between the first terminal and the second terminal, and the capacitor dielectric layer is a ferroelectric material including one or more selected from the group consisting of $ZrO_2$, ZrAlSiO, $HfO_2$, $HfZrO_2$, $HfO_2$ doped with Zr ($HfZrO_x$), $HfO_2$ doped with Al (HfA-$lO_x$), and $HfO_2$ doped with Si ($HfSiO_x$). In one or more of the foregoing and/or following embodiments, a thickness of the capacitor dielectric layer is in a range from 1.0 nm to 10 nm. In one or more of the foregoing and/or following embodiments, the functional circuit includes a logic circuit. In one or more of the foregoing and/or following embodiments, the functional circuit includes a memory. In one or more of the foregoing and/or following embodiments, the functional circuit includes an internal potential supply line to which sources of a plurality of MOS FETs of the functional circuit are coupled, and a drain of the MOS FET of the switch is coupled to the internal potential supply line and a source of the MOS FET of the switch is coupled to the first potential supply line.

In accordance with another aspect of the present disclosure, a semiconductor device includes a first potential supply line for supplying a first potential, a second potential supply line for supplying a second potential lower than the first potential, a functional circuit, and a switch disposed between the second potential supply line and the functional circuit. The switch includes a MOS FET and a negative capacitor showing a negative capacitance and having a first terminal and a second terminal, and the first terminal is electrically coupled to a gate of the MOS FET. In one or more of the foregoing and/or following embodiments, the first terminal of the negative capacitor is a gate electrode of the MOS FET. In one or more of the foregoing and/or following embodiments, the negative capacitor further includes a capacitor dielectric layer disposed between the first terminal and the second terminal, and the capacitor dielectric layer is a ferroelectric material including one or more selected from the group consisting of $ZrO_2$, ZrAlSiO, $HfO_2$, $HfZrO_2$, $HfO_2$ doped with Zr ($HfZrO_x$), $HfO_2$ doped with Al (HfA-$lO_x$), and $HfO_2$ doped with Si ($HfSiO_x$). In one or more of the foregoing and/or following embodiments, a thickness of the capacitor dielectric layer is in a range from 1.0 nm to 10 nm. In one or more of the foregoing and/or following embodiments, the functional circuit includes a logic circuit. In one or more of the foregoing and/or following embodiments, the functional circuit includes a memory. In one or more of the foregoing and/or following embodiments, the functional circuit includes an internal potential supply line to which drains of a plurality of MOS FETs of the functional circuit are coupled, and a source of the MOS FET of the switch is coupled to the internal potential supply line and a drain of the MOS FET of the switch is coupled to the first potential supply line.

In accordance with another aspect of the present disclosure, a semiconductor device includes a first potential supply line for supplying a first potential, a second potential supply line for supplying a second potential lower than the first potential, a functional circuit, and at least one of a first switch disposed between the first potential supply line and the functional circuit and a second switch disposed between the second potential supply line and the functional circuit. The first switch includes a first MOS FET and a first negative capacitor showing a negative capacitance and having a first terminal and a second terminal, and the first terminal of the first MOS FET is electrically coupled to a gate of the first MOS FET. The first terminal of the first negative capacitor is a first gate electrode of the first MOS FET. The second switch includes a second MOS FET and a second negative capacitor showing a negative capacitance and having a first terminal and a second terminal, and the first terminal of the second MOS FET is electrically coupled to a gate of the second MOS FET. The second terminal of the second negative capacitor is a second gate electrode of the second MOS FET. In one or more of the foregoing and/or following embodiments, the semiconductor device includes both the first switch and the second switch. In one or more of the foregoing and/or following embodiments, the functional circuit includes an internal potential supply line to which sources of a plurality of MOS FETs of the functional circuit are coupled, and a drain of the MOS FET of the switch is coupled to the internal potential supply line and a source of the MOS FET of the switch is coupled to the first potential supply line. In one or more of the foregoing and/or following embodiments, the functional circuit includes a plurality of MOS FETs, and at least one of the plurality of MOS FETs of the functional circuit has a same gate length as at least one of the first MOS FET and the second MOS FET. In one or more of the foregoing and/or following embodiments, the functional circuit includes a plurality of MOS FETs, and at least one of the plurality of MOS FETs of the functional circuit has a same gate dielectric layer thickness as at least one of the first MOS FET and the second MOS FET. In one or more of the foregoing and/or following embodiments, the functional circuit includes a plurality of fin field effect transistors (FinFETs), and the first MOS FET and the second MOS FET are FinFETs.

In accordance with another aspect of the present disclosure, a semiconductor device, includes a first potential supply line for supplying a first potential, a second potential supply line for supplying a second potential lower than the first potential, a functional circuit, and a switch disposed between the first potential supply line and the functional circuit. The switch includes a negative capacitance FET (NC FET), and a gate dielectric layer of the NC FET includes a first dielectric layer and a second dielectric layer disposed over the first dielectric layer. The second dielectric layer includes a ferroelectric material. In one or more of the foregoing and/or following embodiments, the first dielectric layer includes an interfacial layer disposed on a channel of the NC FET and a high-k dielectric layer disposed on the interfacial layer. In one or more of the foregoing and/or following embodiments, the ferroelectric material includes one or more selected from the group consisting of $ZrO_2$, ZrAlSiO, $HfO_2$, $HfZrO_2$, $HfO_2$ doped with Zr ($HfZrO_x$), $HfO_2$ doped with Al ($HfAlO_x$), and $HfO_2$ doped with Si ($HfSiO_x$). In one or more of the foregoing and/or following embodiments, a thickness of the second dielectric layer is in a range from 1.0 nm to 10 nm. In one or more of the foregoing and/or following embodiments, the functional circuit includes a logic circuit. In one or more of the foregoing and/or following embodiments, the functional circuit includes a memory. In one or more of the foregoing and/or following embodiments, the functional circuit includes an internal potential supply line to which sources of a plurality of MOS FETs of the functional circuit are coupled, and a drain of the MOS FET of the switch is coupled to the internal potential supply line and a source of the MOS FET of the switch is coupled to the first potential supply line.

According to another aspect of the present disclosure, a semiconductor device includes a first potential supply line for supplying a first potential, a second potential supply line for supplying a second potential lower than the first potential, a functional circuit, and a switch disposed between the second potential supply line and the functional circuit. The switch includes a negative capacitance FET (NC FET), and a gate dielectric layer of the NC FET includes a first dielectric layer and a second dielectric layer disposed over the first dielectric layer. The second dielectric layer includes a ferroelectric material. In one or more of the foregoing and/or following embodiments, the first dielectric layer includes an interfacial layer disposed on a channel of the NC FET and a high-k dielectric layer disposed on the interfacial layer. In one or more of the foregoing and/or following embodiments, the ferroelectric material includes one or more selected from the group consisting of $ZrO_2$, ZrAlSiO, $HfO_2$, $HfZrO_2$, $HfO_2$ doped with Zr ($HfZrO_x$), $HfO_2$ doped with Al ($HfAlO_x$), and $HfO_2$ doped with Si ($HfSiO_x$). In one or more of the foregoing and/or following embodiments, a thickness of the second dielectric layer is in a range from 1.0 nm to 10 nm. In one or more of the foregoing and/or following embodiments, the functional circuit includes a logic circuit. In one or more of the foregoing and/or following embodiments, the functional circuit includes a memory. In one or more of the foregoing and/or following embodiments, the functional circuit includes an internal potential supply line to which drains of a plurality of MOS FETs of the functional circuit are coupled, and a source of the MOS FET of the switch is coupled to the internal potential supply line and a drain of the MOS FET of the switch is coupled to the first potential supply line.

In accordance with another aspect of the present disclosure, a semiconductor device includes a first potential supply line for supplying a first potential, a second potential supply line for supplying a second potential lower than the first potential, a functional circuit, and at least one of a first switch disposed between the first potential supply line and the functional circuit and a second switch disposed between the second potential supply line and the functional circuit. The first switch includes a first negative capacitance FET (NC FET), a gate dielectric layer of which includes a first dielectric layer and a second dielectric layer disposed over the first dielectric layer. The second dielectric layer includes a ferroelectric material. The second switch includes a second NC FET, a gate dielectric layer of which includes a first dielectric layer and a second dielectric layer disposed over the first dielectric layer. The second dielectric layer includes a ferroelectric material. In one or more of the foregoing and/or following embodiments, the semiconductor device includes both the first switch and the second switch. In one or more of the foregoing and/or following embodiments, the functional circuit includes an internal potential supply line to which sources of a plurality of MOS FETs of the functional circuit are coupled, and a drain of the MOS FET of the switch is coupled to the internal potential supply line and a source of the MOS FET of the switch is coupled to the first potential supply line. In one or more of the foregoing and/or following embodiments, the functional circuit includes a plurality of MOS FETs, and at least one of the plurality of MOS FETs of the functional circuit has a same gate length as at least one of the first MOS FET and the second MOS FET. In one or more of the foregoing and/or following embodiments, the functional circuit includes a plurality of MOS FETs, and a thickness of a gate dielectric layer of at least one of the plurality of MOS FETs of the functional circuit is equal to a thickness of the first gate dielectric layer of at least one of the first MOS FET and the second MOS FET. In one or more of the foregoing and/or following embodiments, the functional circuit includes a plurality of fin field effect transistors (FinFETs), and the first NC FET and the second NC FET are FinFETs.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first potential supply line for supplying a first potential;
a second potential supply line for supplying a second potential lower than the first potential;
a functional circuit including a PMOS transistor and a NMOS transistor; and
a switch disposed between the first potential supply line and one of the PMOS transistor and the NMOS transistor of the functional circuit, wherein:
a voltage potential of the first potential supply line is supplied to the functional circuit via the switch,
the switch includes a negative capacitance (NC) MOS FET showing a negative capacitance, and a drain or a source of the NC MOS FET is directly connected to the first potential supply line without interposing any electronic devices,
the NMOS and PMOS transistors are normal MOS FETs, where in an NC MOS FET, a gate voltage is applied to a gate dielectric layer through a negative capacitor, and in a normal MOS FET, a gate voltage is applied to a gate dielectric layer without a negative capacitor,
a gate dielectric layer of the NC MOS FET includes a first dielectric layer and a second dielectric layer disposed on and in direct contact with the first dielectric layer, and
the second dielectric layer includes a ferroelectric material.

2. The semiconductor device of claim 1, wherein:
the NC MOS FET includes a gate electrode disposed over the second dielectric layer of the gate dielectric layer, and
the gate dielectric layer has a U-shape cross section and a top of the gate dielectric layer is covered by and in direct contact with the gate electrode.

3. The semiconductor device of claim 2, wherein the ferroelectric material is one or more selected from the group consisting of $ZrO_2$, ZrAlSiO, $HfO_2$, $ZrO_2$ doped with Si, $ZrO_2$ doped with Al $HfZrO_2$, $HfO_2$ doped with Zr ($HfZrO_x$), $HfO_2$ doped with Al ($HfAlO_x$), and $HfO_2$ doped with Si ($HfSiO_x$).

4. The semiconductor device of claim 3, wherein a thickness of the second dielectric layer is in a range from 1.0 nm to 10 nm.

5. The semiconductor device of claim 1, wherein the functional circuit includes a static random access memory.

6. The semiconductor device of claim 1, wherein the switch is disposed between the first potential supply line and the PMOS transistor.

7. The semiconductor device of claim 6, wherein:
the functional circuit includes an internal potential supply line to which a source of the PMOS transistor is coupled, and
the drain of the NC MOS FET of the switch is coupled to the internal potential supply line and the source of the NC MOS FET of the switch is coupled to the first potential supply line.

8. The semiconductor device of claim 1, wherein the switch is disposed between the first potential supply line and the NMOS transistor.

9. The semiconductor device of claim 8, wherein:
the functional circuit includes an internal potential supply line to which a drain of the NMOS transistor is coupled, and
the source of the NC MOS FET of the switch is coupled to the internal potential supply line and the drain of the NC MOS FET of the switch is coupled to the first potential supply line.

10. A semiconductor device, comprising:
a first potential supply line for supplying a first potential;
a second potential supply line for supplying a second potential lower than the first potential;
a functional circuit including a CMOS circuit constituted by normal MOS FETs; and
a switch disposed between the first potential supply line and the CMOS circuit of the functional circuit, wherein:
a voltage potential of the first potential supply line is supplied to the CMOS circuit via the switch, and
the switch consists of a negative capacitance (NC) MOS FET,
in an NC MOS FET, a gate voltage is applied to a gate dielectric layer through a negative capacitor, and in a normal MOS FET, a gate voltage is applied to a gate dielectric layer without a negative capacitor,
a gate dielectric layer of the NCFET includes a first dielectric layer and a second dielectric layer disposed on and in direct contact with the first dielectric layer, a gate electrode disposed on and in direct contact with the first dielectric layer and the second dielectric layer,
the second dielectric layer includes a ferroelectric material, and
a top of the first and second gate dielectric layers is below a top of the gate electrode.

11. The semiconductor device of claim 10, wherein the CMOS circuit is an inverter.

12. The semiconductor device of claim 10, wherein the ferroelectric material is one or more selected from the group consisting of $ZrO_2$, ZrAlSiO, $ZrO_2$ doped with Si, $ZrO_2$ doped with Al $HfO_2$, $HfZrO_2$, $HfO_2$ doped with Zr ($HfZrO_x$), $HfO_2$ doped with Al ($HfAlO_x$), and $HfO_2$ doped with Si ($HfSiO_x$).

13. The semiconductor device of claim 12, wherein a thickness of the second dielectric layer is in a range from 1.0 nm to 10 nm.

14. The semiconductor device of claim 10, wherein:
the functional circuit includes a first internal potential supply line and a second internal potential supply line, and
the CMOS circuit is disposed between and coupled to the first and second potential supply lines.

15. A semiconductor device, comprising:
a first potential supply line for supplying a first potential;
a first internal potential supply line and a second internal potential supply line separated from the first internal potential supply line, both for supplying the first potential;
a second potential supply line for supplying a second potential lower than the first potential;
a first functional circuit including a PMOS transistor and a NMOS transistor;
a second functional circuit including a PMOS transistor and a NMOS transistor;
a first negative capacitance (NC) FET disposed between the first potential supply line and the first internal potential supply line; and a second NC FET disposed between the first potential supply line and the second internal potential supply line, wherein:

the NMOS and PMOS transistors are normal MOS FETs, in an NC MOS FET, a gate voltage is applied to a gate dielectric layer through a negative capacitor, and in a normal MOS FET, a gate voltage is applied to a gate dielectric layer without a negative capacitor, each of the first and second NC FETs includes a first dielectric layer and a second dielectric layer disposed over the first dielectric layer, a gate electrode disposed over the second dielectric layer, the second dielectric layer includes a ferroelectric material, and a top of the first and second gate dielectric layers is below a top of the gate electrode.

16. The semiconductor device of claim 15, wherein the functional circuit includes a CMOS inverter constituted by normal MOS FETs.

17. The semiconductor device of claim 15, wherein the ferroelectric material is one or more selected from the group consisting of $ZrO_2$, ZrAlSiO, $HfO_2$, $HfZrO_2$, $HfO_2$ doped with Zr ($HfZrO_x$), $HfO_2$ doped with Al ($HfAlO_x$), and $HfO_2$ doped with Si ($HfSiO_x$).

18. The semiconductor device of claim 17, wherein a thickness of the second dielectric layer is in a range from 1.0 nm to 10 nm.

19. The semiconductor device of claim 15, wherein the functional circuit includes a static random access memory.

20. The semiconductor device of claim 15, further comprising:

a third internal potential supply line and a fourth internal potential supply line separated from the third internal potential supply line, both for supplying the second potential;

a third NC FET disposed between the second potential supply line and the third internal potential supply line; and a fourth NC FET disposed between the second potential supply line and the fourth internal potential supply line.

* * * * *